(12) United States Patent
Zanoni et al.

(10) Patent No.: US 8,456,336 B1
(45) Date of Patent: Jun. 4, 2013

(54) OPTICAL DESERIALIZATION WITH GATED DETECTORS: SYSTEM AND METHOD

(75) Inventors: Raymond Zanoni, Columbia, MD (US); Kim S. Jepsen, Ellicott City, MD (US); Mark A. Laliberte, Crownsville, MD (US); Oliver S. King, Frederick, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 84 days.

(21) Appl. No.: 13/240,226

(22) Filed: Sep. 22, 2011

(51) Int. Cl.
*H03M 1/12* (2006.01)
(52) U.S. Cl.
USPC .................................... 341/137; 395/202
(58) Field of Classification Search
None
See application file for complete search history.

(56) References Cited

U.S. PATENT DOCUMENTS

| | | | |
|---|---|---|---|
| 6,118,396 A | 9/2000 | Song | |
| 6,459,522 B2 | 10/2002 | Yariv | |
| 6,525,682 B2 | 2/2003 | Yap et al. | |
| 6,661,361 B1 | 12/2003 | Lewis et al. | |
| 6,700,517 B1 | 3/2004 | Kellar | |
| 7,826,752 B1 * | 11/2010 | Zanoni et al. | 398/205 |
| 7,868,799 B1 | 1/2011 | Price et al. | |
| 7,876,246 B1 | 1/2011 | Price et al. | |
| 2012/0213531 A1 * | 8/2012 | Nazarathy et al. | 398/202 |
| 2012/0224184 A1 * | 9/2012 | Li et al. | 356/491 |

OTHER PUBLICATIONS

Clark et al., Photonics for RF Front Ends, IEEE microwave magazine, May 2011, 9 pages.
U.S. Appl. No. 13/204,158, filed Aug. 5, 2011, Zanoni et al.
U.S. Appl. No. 13/536,929, filed Jun. 28, 2012, Zanoni et al.
U.S. Appl. No. 13/626,642, filed Sep. 25, 2012, Zanoni et al.
Clark et al., Coherent Optical Phase-Modulation Link, IEEE Photonics Technology Letters, Aug. 15, 2007, 3 pages, vol. 19, No. 16.
Valley et al., Photonic analog-to-digital converters: fundamental and practical limits, Integrated Optical Devices, Nanostructures, and Displays, Proceedings of SPIE, 2004, 11 pages, vol. 5618.
Valley, George C., Photonic Analog-to-Digital Converters, A Tutorial, The Aerospace Corporation, 2009, 48 pages.
Valley, George C., Photonic analog-to digital converters, The Aerospace Corporation, Mar. 5, 2007, vol. 15, No. 5, 28 pages.
Zibar et al., Digital Coherent Receiver Employing Photonic Downconversion for Phase Modulated Radio-over-Fibre Links, downloaded on Aug. 2, 2010 from IEEE Xplore, 4 pages.
Zibar et al., Digital Coherent Receiver for Phase-Modulated Radio-Over-Fiber Optical Links, IEEE Photonics Technology Letters, Feb. 1, 2009, 3 pages, vol. 21, No. 3.

\* cited by examiner

*Primary Examiner* — Howard Williams
(74) *Attorney, Agent, or Firm* — Donna P. Suchy; Daniel M. Barbieri (57) ABSTRACT

A method of performing optical serial-to-parallel conversion of an optical signal includes performing phase modulation of the optical pulse stream and outputting a phase-modulated optical signal. Optical switching of the phase-modulated optical signal is performed by optical switches provided on a signal path. Optical switching of a reference optical clock signal is performed by optical switches provided on a reference path. I/Q demodulation of the optically switched phase-modulated optical signal respectively output by an optical switch is performed on the signal path at timings corresponding to the optically switched reference optical clock signal respectively output by an optical switch on the reference path, in which I and Q demodulated signals are output as a result thereof. Photodetection of the I and Q demodulated signals is then performed.

26 Claims, 8 Drawing Sheets

OPTICAL DESERIALIZATION WITH GATED DETECTORS: SYSTEM AND METHOD

FIELD OF THE INVENTION

The present specification relates to optical deserialization with gated detectors. More particularly, the present specification relates to a photonic analog-to-digital converter (pADC) that performs optical deserialization with gated detectors for use in high frequency (e.g., 100+ MHz and multi-GHz) radio frequency (rf) systems.

Optical system designers have utilized optical deserialization as a component of pADCs used in high frequency (e.g., 100+ MHz and multi-GHz) systems. Fundamental performance limits of conventional pADCs significantly constrain the potential of these devices, such as systems operating wide band in excess of several GHz.

Therefore, there is a need to have a pADC that performs optical deserialization with gated detectors and that has increased resolution compared to a conventional pADC that performs optical deserialization.

SUMMARY OF THE INVENTION

An exemplary embodiment relates to a photonic Analog-to-Digital Converter (pADC) that includes a phase modulator that is configured to receive an rf signal and to output a phase-modulated optical clock signal as a result thereof. The pADC also includes a plurality of optical switches connected in a series relationship to each other along a signal path, the plurality of optical switches on the signal path performing optical switching of the phase-modulated optical signal output by the phase modulator in accordance with the series relationship by which the plurality of optical switches on the signal path are connected to each other. The pADC further includes a plurality of optical switches connected in a series relationship to each other along a reference path, the plurality of optical switches on the reference path performing optical switching of a reference optical signal in accordance with the series relationship by which the plurality of optical switches on the reference path are connected to each other. The method still further includes a plurality of I/Q demodulators respectively connected to receive sampled outputs from the plurality of optical switches on the signal path and to receive switched outputs from the plurality of optical switches on the reference path, in which each of the plurality of I/Q demodulators performs I and Q demodulation of the received switched outputs from the plurality of optical switches on the signal path at timings corresponding to the switched outputs of the plurality of optical switches on the reference path, and in which each of the plurality of I/Q demodulators outputs an I demodulated signal and a Q demodulated signal as a result thereof. The method also includes a plurality of pairs of gated photodetectors respectively connected to the plurality of I/Q demodulators, in which one of each of the pairs of gated photodetectors receives the I demodulated signal output from the respective I/Q demodulator and the other one of each of the pairs of gated photodetectors receives the Q demodulated signal output from the respective I/Q demodulator, and in which each of the pairs of gated photodetectors performs photodetection of the respective I demodulated signal and the Q demodulated signal output by the respective I/Q demodulator.

Another exemplary embodiment relates to a method of performing optical serial-to-parallel conversion of an rf signal. The method includes modulating the phase of the optical clock signal in proportion to the rf input signal and outputting a phase-modulated optical signal as a result thereof. The method also includes performing optical switching of the phase-modulated optical signal by a plurality of optical switches connected to each other in a series relationship on a signal path. The method further includes performing optical switching of a reference optical clock signal by a plurality of optical switches connected to each other in a series relationship on a reference path. The method still further includes performing, by a plurality of I/Q demodulators, I/Q demodulation of the optically sampled phase-modulated optical signal respectively output by one of the plurality of optical switches on the signal path at timings corresponding to the optically switched reference optical clock signal respectively output by one of the plurality of optical switches on the reference path, in which the plurality of I/Q demodulators respectively output I and Q demodulated signals as a result thereof. The method also includes performing, by a plurality of pairs of gated photodetectors respectively connected to the plurality of I/Q demodulators, photodetection of the I and Q demodulated signals respectively output of the plurality of I/Q demodulators.

Another exemplary embodiment relates to a computer readable medium storing computer program product that, when executed by a computer, causes the computer to perform a functions of:

instruct a phase modulator to perform phase modulation of the optical clock signal in proportion to the rf input signal and to output a phase-modulated optical signal as a result thereof;

instruct a plurality of optical switches connected to each other in a series relationship on a signal path to perform optical switching of the phase-modulated optical signal;

instruct a plurality of optical switches connected to each other in a series relationship on a reference path to perform optical switching of a reference optical clock signal;

instruct a plurality of I/Q demodulators to perform I/Q demodulation of the optically switched phase-modulated optical signal respectively output by one of the plurality of plurality of optical switches on the signal path at timings corresponding to the optically switched reference optical clock signal respectively output by one of the plurality of plurality of optical switches on the reference path, in which the plurality of I/Q demodulators respectively output I and Q demodulated signals as a result thereof; and instruct a plurality of pairs of gated photodetectors respectively connected to the plurality of I/Q demodulators to perform photodetection of the I and Q demodulated signals respectively output of the plurality of I/Q demodulators.

Yet another exemplary embodiment relates to a photonic Analog-to-Digital Converter (pADC), which includes a phase modulator that is configured to received an rf signal and to output a phase-modulated optical signal as a result thereof; an I/Q demodulator configured to receive the phase-modulated optical signal output by the phase modulator on a signal path, and to perform I and Q demodulation of the phase-modulated optical signal at timings corresponding to a reference clock signal received on a reference path, wherein the I/Q demodulator outputs an I demodulated signal and a Q demodulated signal as a result thereof; and first and second photodetectors connected to the I/Q demodulator and configured to receive and detect the I demodulated signal and a Q demodulated signal, respectively.

Still yet another exemplary embodiment relates to a method of performing optical serial-to-parallel conversion of an rf signal, which includes phase modulating an optical clock signal in proportion to an input rf input signal and outputting a phase-modulated optical signal as a result thereof; performing I and Q demodulation of the phase-modulated optical signal at timings corresponding to a reference clock signal received on a reference path, and outputting an I demodulated signal and a Q demodulated signal as a result thereof; and receiving and detecting, by way of first and second photodetectors, the I demodulated signal and a Q demodulated signal, respectively.

BRIEF DESCRIPTION OF THE DRAWINGS

Exemplary embodiments are hereafter described with reference to the accompanying drawings, wherein like numerals denote like elements; and.

DETAILED DESCRIPTION OF THE PREFERRED EMBODIMENTS

Before describing in detail the particular improved system and method, it should be observed that the invention includes, but is not limited to, a novel structural combination of optical components and not in the particular detailed configurations thereof. Accordingly, the structure, methods, functions, control and arrangement of components have been illustrated in the drawings by readily understandable block representations and schematic drawings, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

At least one embodiment relates to an optical deserializer with gated detectors utilized in a pADC, for example, a pADC provided in a wideband or narrowband rf receiver. The pADC can be used for different types of receiving applications, including but not limited to applications associated with radios (e.g., software defined radio, radio receivers capable of wideband or narrowband receiver operations, etc.), radars (e.g, a digital radar), and sensors.

The present invention relates to a method known in the art as Multi-Dimensional Quantization (MDQ), and improves on MDQ methods and apparatuses described, for example, in U.S. Pat. No. 7,868,799. In general, technical benefits of the MDQ method includes the capability to: increase the ENOB of the photonic ADC over that of the constituent electronic ADCs; increase the SFDR of the photonic ADC over that of the constituent electronic ADCs; enable the use of optical or hybrid optical/electrical deserialization to reduce the effective sample rate presented to each electronic ADC; allow for simple correction for various imperfections of the optical receiver. Performing the sampling process using phase modulated optical pulses, as contrasted to simply relaying the RF signal on a phase modulated continuous wave optical carrier to an electronic ADC for sampling is important. This is because optical sampling allows the sampling to occur using an ultra-low jitter optical pulse source. Without the low jitter associated with optical sampling, the above benefits cannot be realized, because the performance will be limited by the clock jitter on the clock that drives the electronic ADCs. Various embodiments of the present invention can achieve one or more of the benefits described above.

Figure 1:
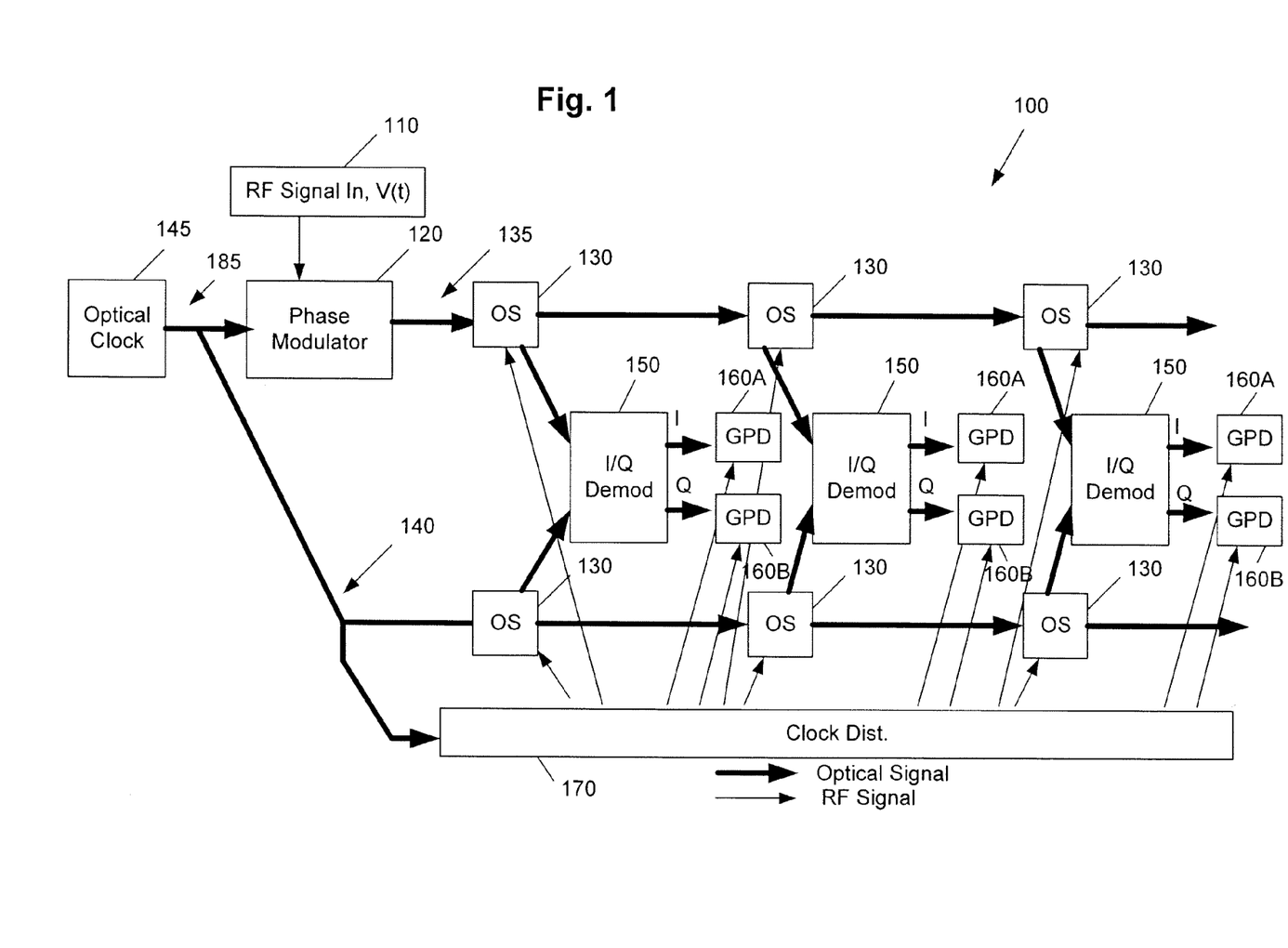
FIG. 1 is a block diagram of a photonic ADC (pADC) according to a first exemplary embodiment.

FIG. 1 shows a pADC 100 according to a first embodiment. The pADC 100 includes an optical clock 145 for the purpose of supplying a high repetition rate stream of optical pulses with very low clock jitter. Examples of this type of device include the mode locked laser (MLL) and coupled optoelectronic oscillator (COED).

The pADC 100 receives an rf voltage V(t) of an rf input signal 110. The rf input signal 110 can be received by a wide band antenna (not shown in FIG. 1), for example. The rf input signal 110 is input to a phase modulator 120, which performs phase modulation on the optical clock signal and which outputs a phase-modulated optical pulse stream.

The pADC 100 also includes a plurality of optical switches (OS) 130 connected in a series relationship to each other along a signal path 135. The plurality of optical switches 130 on the signal path 135 perform optical switching of the phase-modulated optical signal output by the phase modulator 120 in accordance with the series relationship by which the plurality of optical switches 130 on the signal path 135 are connected to each other.

The pADC 100 further includes a plurality of optical switches (OS) 130 connected in a series relationship to each other along a reference path 140. The plurality of optical switches 130 on the reference path 140 perform optical switching of a reference optical signal output by an optical clock circuit 145 in accordance with the series relationship by which the plurality of optical switches 130 on the reference path 140 are connected to each other.

The pADC 100 also includes a plurality of I/Q demodulators 150 respectively connected to receive switched outputs from the plurality of optical switches 130 on the signal path 135 and to receive switched outputs from the plurality of optical switches 130 on the reference path 140. Each of the plurality of I/Q demodulators 150 performs I/Q demodulation of the received switched outputs from the plurality of optical switches 130 on the signal path 135 at timings corresponding to the switched outputs of the plurality of optical switches 130 on the reference path 140. Each of the plurality of I/Q demodulators outputs an I demodulated signal and a Q demodulated signal as a result of the I/Q demodulation that it performs on the optically-switched phase-modulated optical signal.

The pADC 100 further includes a plurality of pairs of gated photodetectors 160A, 160B respectively connected to the plurality of I/Q demodulators 150. One of the pair of gated photodetectors 160A receives the I demodulated signal output from the respective I/Q demodulator 150, and the other one of the pair of gated photodetectors 160B receives the Q demodulated signal output from the respective I/Q demodulator 150. Each of the pairs of gated photodetectors 160A, 160B performs photodetection of the respective I demodulated signal and the Q demodulated signal output by the respective I/Q demodulator.

The pADC 100 also includes a clock distribution unit 170 that outputs clock signals to the plurality of pairs of gated photodetectors 160A, 160B, as well as to the optical switches 130. Each of the plurality of pairs of gated photodetectors 160A, 160B performs photodetection of the respective I demodulated signal and the Q demodulated signal output by the respective I/Q demodulator 150 at timings in accordance with the clock signal that it receives (e.g., at a rising edge or falling edge of each clock signal pulse).

The plurality of pairs of gated photodetectors 160A, 160B hold the respective I demodulated signal and the Q demodulated signal output by the respective I/Q demodulator 150 for a clock cycle of the clock signal, and thereby perform a "hold" function of a sample-and-hold circuit. The optical clock signal 185 is comprised of short optical pulses with a repetition rate satisfying the Nyquist criterion with respect to the RF input signal. The phase modulator 120 accepts this clock signal and imparts to it a phase modulation proportional to the rf input signal and thereby performs a "sample" function of a sample-and-hold circuit.

As shown in FIG. 1, the signal path 135 and the reference path 140 are separate paths that do not directly intersect or directly connect with each other, but whereby both paths provide input signals to the I/Q demodulators 150.

An optical clock circuit 145 outputs a reference optical clock signal 185 to the phase modulator 120 and to the reference path 140. Based on the rf signal 110 input to it, the phase modulator 120 performs phase modulation of the optical clock signal 185 resulting in a phase modulated optical pulse signal. The reference optical clock signal 185 is also provided as in input to the clock distribution unit 170, for it to use in providing clock signals to various components of the pADC 100.

Figure 2:
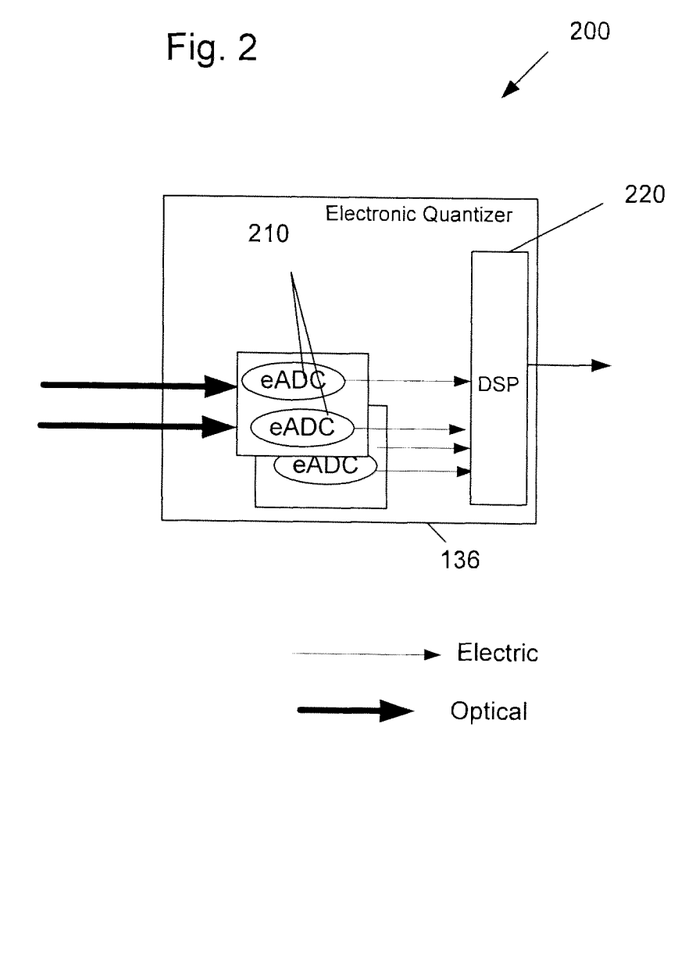
FIG. 2 is a block diagram of an electronic quantizer that may be utilized to further process outputs of a pADC according to an exemplary embodiment.

The pADC 100 of FIG. 1 can operate as an optical serial-to-parallel converter that enables a serial stream of samples, e.g., 20 GHz samples of an input rf signal, to be clocked into a parallel array of I/Q demodulators 150. By utilizing gated photodetectors 160A, 160B, the optical pulses can be captured and held until electronic quantizers digitize the "held" signals. FIG. 2 shows one implementation of an electronic quantizer 200 that may be utilized with the pADC 100 of the first embodiment, in which the electronic quantizer 200 receives the "held" signals of the gated photodetectors 160A, 160B, and performs digitization of those signals. The electronic quantizer 200 includes a plurality of electronic ADCs 210, which provide their respective outputs to a digital signal processor (DSP) 220. The DSP 220 may perform additional digital processing of the received signals, such as filtering, smoothing, interleaving and the like.

In the pADC 100 according to the first embodiment as shown in FIG. 1, the sampling is performed of the received signal in the optical domain, which is something not done in conventional sample-and-hold circuits used in rf front ends. Also, the holding function of the sample-and-hold circuit of FIG. 1 is accomplished with a combination of electronics and optical components, again something different than what is done in conventional sample-and-hold circuits used in rf front ends.

Test results of the pADC 100 according to the first embodiment as shown in FIG. 1 show that input voltage requirements can be reduced from 15 to 20 volts as required by conventional pADCs, to a factor of four or more (i.e., between 3 to 4 volts input voltage level to the pADC 100 of FIG. 1). Also, the input power requirement of the pADC 100 according to the first embodiment as shown in FIG. 1 can be reduced by more than 14 dB as compared to the input power requirement of a conventional pADC.

Figure 3:
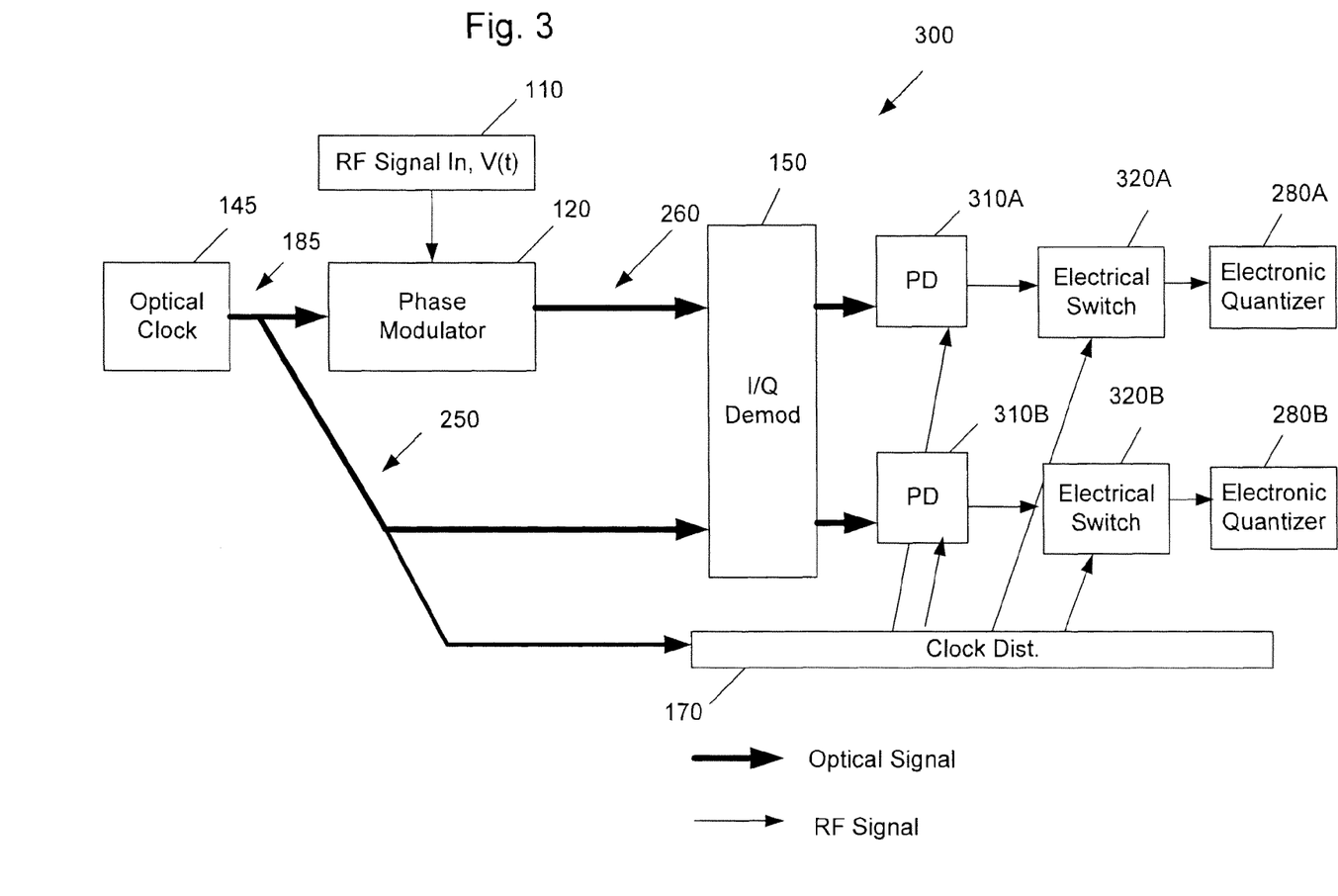
FIG. 3 is a block diagram of a pADC according to a second exemplary embodiment.

A pADC 300 according to a second embodiment is shown with reference to FIG. 3. The pADC 300 includes an optical clock 145 that outputs a reference optical clock signal 185 to a phase modulator 120 and to a reference path 250. The phase modulator 120 performs phase modulation of the optical clock signal 185 in proportion to the input rf signal 120 resulting in a phase modulated optical signal. The phase-modulated output of the phase modulator 120 is provided on a signal path 260. Unlike the first embodiment of a pADC 100 shown in FIG. 1, no optical switches (OS) are utilized in the second embodiment.

The pADC 300 also includes an I/Q demodulator 150 that receives the phase-modulated rf signal output by the phase modulator 120 on the signal path 260, and that receives the reference optical clock signal 185 on the reference path 250. Like the first embodiment, the I/Q demodulator 150 performs I and Q demodulation of the phase-modulated optical signal at timings corresponding to the reference optical clock signal 185, and the I/Q demodulator 150 outputs an I demodulated signal and a Q demodulated signal as a result of the I/Q demodulation that it performs on the phase-modulated optical signal.

The pADC 300 further includes a plurality of pairs of gated photodetectors 160A, 160B respectively connected to the I and Q outputs of the I/Q demodulator 150. The gated photodetector 160A receives the I demodulated signal output from the I/Q demodulator 150, and the gated photodetector 160B receives the Q demodulated signal output from the I/Q demodulator 150. The gated photodetectors 160A, 160B respectively perform photodetection of the respective I demodulated signal and the Q demodulated signal output by the I/Q demodulator 150.

The pADC 300 also includes a clock distribution unit 170 that outputs a clock signal to the gated photodetectors 160A, 160B. The gated photodetectors 160A, 160B perform photodetection of the respective I demodulated signal and the Q demodulated signal output by the respective I/Q demodulator 150 at timings in accordance with the clock signal (e.g., at a rising edge or falling edge of each clock signal pulse).

As shown in FIG. 3, the signal path 260 and the reference path 250 are separate paths that do not directly intersect or directly connect with each other, but whereby each paths provides one input to the I/Q demodulator 150.

Also shown in the pADC 300 of FIG. 3 are electronic quantizers 280A, 280B, which respectively perform electronic quantization of signals held by electrical switches 320A, 320B. By way of example, the electronic quantizers 280A, 280B may include the components shown in FIG. 2. The output of the photodetectors 310A, 310B is held by electrical switches 320A, 320B, respectively, whereby the electrical switches 320A, 320B are clocked based on the clock signal output by the clock distribution unit 170

Figure 4:
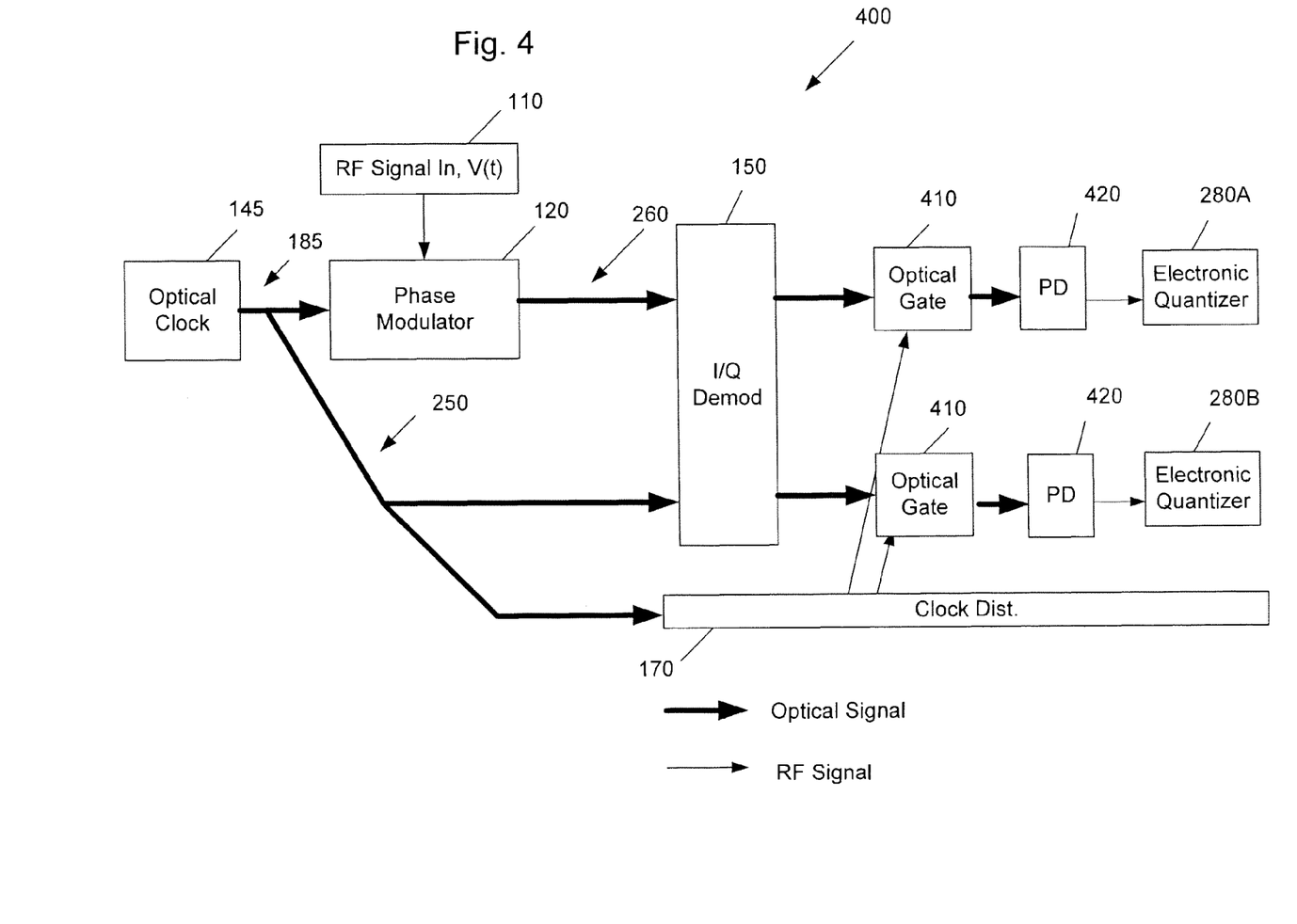
FIG. 4 is a block diagram of a pADC according to a third exemplary embodiment.

A pADC 400 according to a third embodiment is shown with reference to FIG. 4. The pADC 400 is similar in construction to the pADC 300 according to the second embodiment as shown in FIG. 3, but in which the electronic switches 320A, 320B of the second embodiment are replaced by optical gates provided on each of the I and Q output paths of the I/Q demodulator 150. Thus, unlike the second embodiment, in the third embodiment the signals output by the I/Q demodulator 150 are first optically gated, and then photodetected. That way, during the optical gating performed by the optical gates 410, there is reduced capacitive coupling with the electronic clock signal output by the clock distribution unit 170 to the optical gates 410, since the gating of the I/Q demodulated outputs is performed in the 'optical' realm and not the 'electronic' realm. Accordingly, the pADC 400 according to the third embodiment may reduce the capacitive coupling, which is a limitation of eADCs, and thus may result in improved performance of the pADC 400 as compared to the second embodiment.

Figure 5:
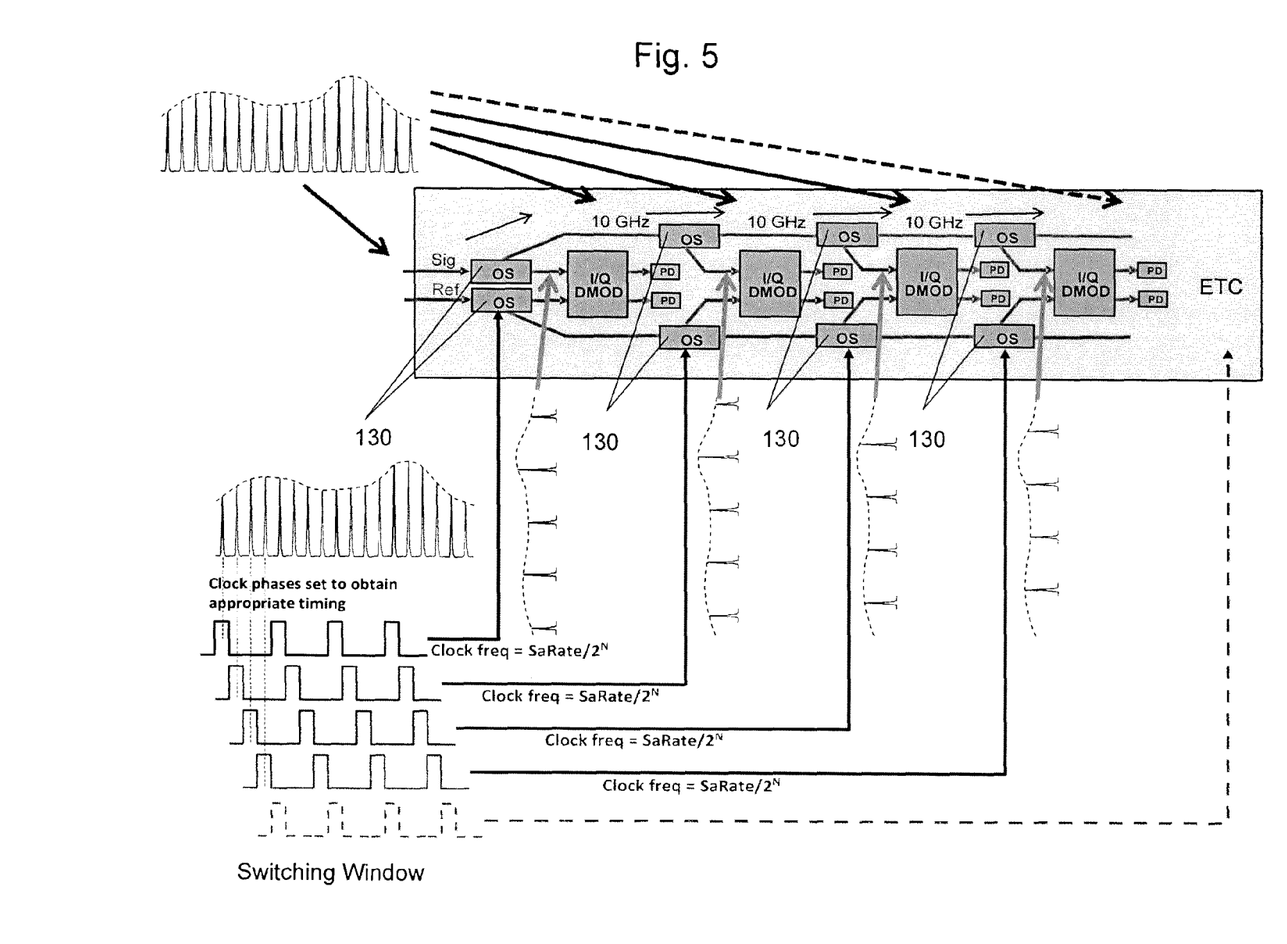
FIG. 5 is a block diagram of a clock distribution tree for the clock signals provided to components of a pADC or optical deserializer with gated detectors according to the first exemplary embodiment.

FIG. 5 is a block diagram of a clock distribution tree for the clock signals provided to components of a pADC or optical deserializer with gated detectors by the clock distribution unit according to the first exemplary embodiment. The first stage of optical switches (OSs) 130 on the signal and reference paths receive a first clock signal having a clock frequency of SaRate/2 ("SaRate" corresponds to Sampling Rate), the second stage of OSs 130 on the signal and reference paths receive a second clock signal having a clock frequency of SaRate/4, ..., and the $n^{th}$ stage of OSs 130 on the signal and reference paths receive an $n^{th}$ clock signal having a clock frequency of SaRate/$2^n$. FIG. 5 also shows that the switching window shifts for each of the first through $n^{th}$ stages of OSs 130.

Figure 6:
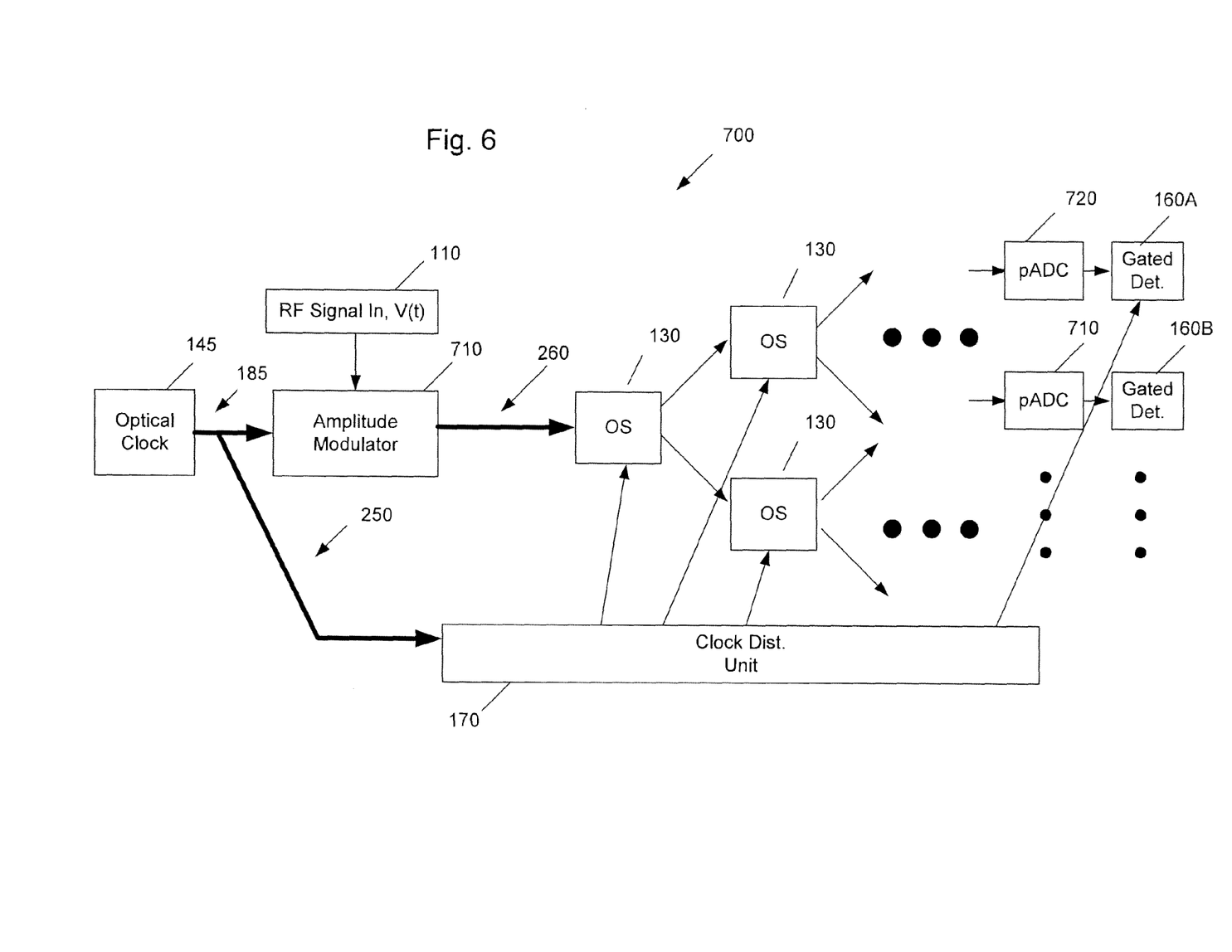
FIG. 6 is a block diagram of an optical deserializer with gated detectors according to a fourth exemplary embodiment.

FIG. 6 shows an optical deserializer with gated detectors 700 according to a fourth embodiment, in which the optical clock signal is amplitude modulated according to RF input signal 110 by amplitude modulator 710, The amplitude-modulated output of the amplitude modulator 710 is provided to n stages of optical switches 130 (n being an integer greater than one). The output of the last (nth) stage of optical switches 130 is provided to a plurality of pADCs 720, which perform analog-to-digital conversion of the optically-switched signals output by the last stage of optical switches 130. The digital outputs of the pADCs 720 are held by gated detectors 160A, 160B, ..., to provide the "hold" function of a sample-and-hold circuit.

Figure 7:
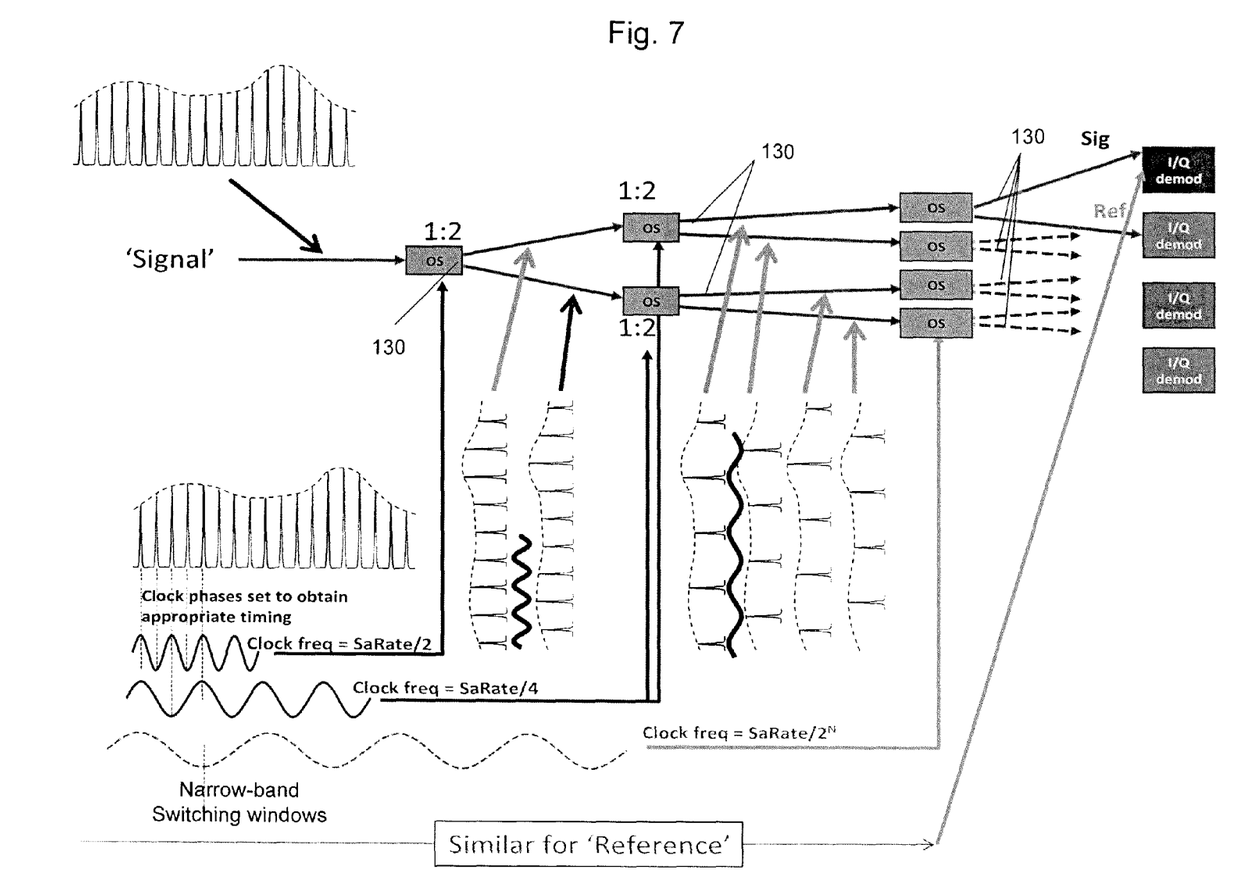
FIG. 7 is a block diagram of a clock distribution tree for the clock signals provided to components of a pADC or optical deserializer according to the fourth exemplary embodiment.

FIG. 7 is a block diagram of a clock distribution tree for the clock signals provided to components of a pADC or optical deserializer with gated detectors by the clock distribution unit according to the fourth exemplary embodiment. FIG. 7 also shows that the switching window shifts for each of the first through $n^{th}$ stages of OSs 130 in the pADC or optical deserializer with gated detectors according to the fourth exemplary embodiment.

Figure 8:
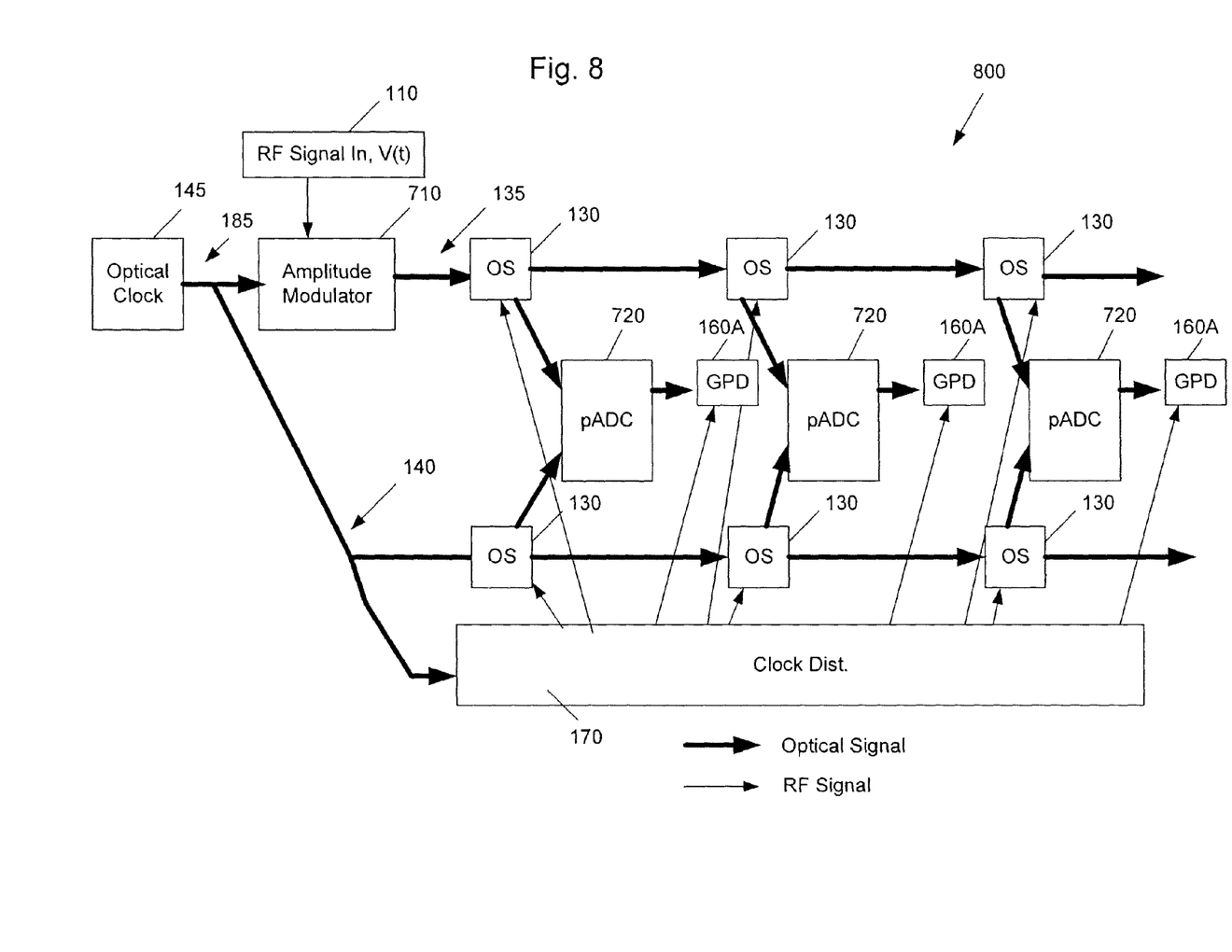
FIG. 8 is a block diagram of an optical deserializer with gated detectors according to a fifth exemplary embodiment.

FIG. 8 shows an optical deserializer with gated detectors 800 according to a fifth embodiment. The configuration of the optical deserializer with gated detectors 700 is similar to that as shown in FIGS. 1 and 3, but with the clock signal being amplitude modulated by amplitude modulator 710 according to the RF input signal 110 instead of being phase modulated by a phase modulator. Also, the processing of the rf input signal is shown as being performed by pADCs 720 instead of by I/Q Demodulators, whereby the pADCs provide digital outputs to gated detector 160A, 160B, ....

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of optical component, dimensions and angles are mentioned, other components, dimensions and angles can be utilized. Also, while an optical deserialization with gated detectors system and method have been described above with respect to inclusion in a wideband or a narrow-band receiver, it can be implemented in other types of high-frequency band receivers, such as receivers operating up to hundreds of GHz. Various changes may be made to the details disclosed without departing from the spirit of the invention which is defined by the following claims.

What is claimed is:

1. A photonic Analog-to-Digital Converter (pADC), comprising:
    an optical phase modulator that is configured to receive an rf signal, an optical pulse signal, and to output a phase-modulated optical pulse signal as a result thereof;
    a plurality of optical switches connected in a series relationship to each other along a signal path, the plurality of optical switches on the signal path configured to perform optical switching of the phase-modulated optical pulse signal output by the phase modulator in accordance with the series relationship by which the plurality of optical switches on the signal path are connected to each other;
    a plurality of optical switches connected in a series relationship to each other along a reference path, the plurality of optical switches on the reference path configured to perform optical switching of a reference optical clock signal in accordance with the series relationship by which the plurality of optical switches on the reference path are connected to each other;
    a plurality of I/Q demodulators respectively connected to receive switched outputs from the plurality of optical switches on the signal path and to receive switched outputs from the plurality of optical switches on the reference path, in which each of the plurality of I/Q demodulators is configured to perform I and Q demodulation of the received switched outputs from the plurality of optical switches on the signal path at timings corresponding to the switched outputs of the plurality of optical switches on the reference path, and in which each of the plurality of I/Q demodulators is configured to output an I demodulated signal and a Q demodulated signal as a result thereof; and
    a plurality of pairs of gated photodetectors respectively connected to the plurality of I/Q demodulators, in which one of each of the pairs of gated photodetectors receives the I demodulated signal output from the respective I/Q demodulator and the other one of each of the pairs of gated photodetectors receives the Q demodulated signal output from the respective I/Q demodulator, and in which each of the pairs of gated photodetectors is configured to perform photodetection of the respective I demodulated signal and the Q demodulated signal output by the respective I/Q demodulator.

2. The pADC according to claim 1, further comprising:
    a clock generator configured to output a clock signal to the plurality of pairs of gated photodetectors,
    wherein each of the plurality of pairs of gated photodetectors performs photodetection of the respective I demodulated signal and the Q demodulated signal output by the respective I/Q demodulator in accordance with the clock signal.

3. The pADC according to claim 2, wherein the plurality of pairs of gated photodetectors hold the respective I demodulated signal and the Q demodulated signal output by the respective I/Q demodulator for a clock cycle of the clock signal.

4. The pADC according to claim 3, wherein the pADC operates as a sample-and-hold circuit in which the reference optical clock signal and phase modulator perform a sample function of the sample-and-hold circuit and in which the plurality of pairs of gated photodetectors perform a hold function of the sample-and-hold circuit.

5. The pADC according to claim 1, wherein the signal path and the reference path are separate paths that do not directly intersect or directly connect with each other.

6. The pADC according to claim 1, further comprising:
an optical clock configured to output the reference optical clock signal to the phase modulator and to the reference path, in which the phase modulator performs phase modulation of the optical clock signal proportional to the RF input signal.

7. A method of performing optical serial-to-parallel conversion of a phase encoded optical signal, comprising:
performing phase modulation of a train of optical pulses and outputting a phase-modulated optical pulse stream as a result thereof;
performing optical switching of the phase-modulated optical pulse stream by a plurality of optical switches connected to each other in a series relationship on a signal path;
performing optical switching of a reference optical clock signal by a plurality of optical switches connected to each other in a series relationship on a reference path;
performing, by a plurality of I/Q demodulators, I/Q demodulation of the optically switched phase-modulated optical pulse stream respectively output by one of the plurality of optical switches on the signal path at timings corresponding to the optically switched reference optical clock signal respectively output by one of the plurality of optical switches on the reference path, in which the plurality of I/Q demodulators respectively output I and Q demodulated signals as a result thereof; and
performing, by a plurality of pairs of gated photodetectors respectively connected to the plurality of I/Q demodulators, photodetection of the I and Q demodulated signals respectively output of the plurality of I/Q demodulators.

8. The method according to claim 7, wherein each of the plurality of pairs of gated photodetectors performs photodetection of the respective I demodulated signal and the Q demodulated signal output by the respective I/Q demodulator in accordance with a clock signal.

9. The method according to claim 8, further comprising:
holding, by the plurality of pairs of gated photodetectors, the respective I demodulated signal and the Q demodulated signal output by the respective I/Q demodulator for a clock cycle of the clock signal.

10. The method according to claim 9, wherein a sample-and-hold function is performed in which the optical clock signal and phase modulator perform a sample function and in which the plurality of pairs of gated photodetectors perform a hold function.

11. The method according to claim 7, wherein the signal path and the reference path are separate paths that do not directly intersect or directly connect with each other.

12. The method according to claim 7, wherein the phase modulation of the rf signal is performed at timings corresponding to the reference optical clock signal.

13. A non-transitory computer readable medium storing computer program code, which, when executed by at least one computer, causes the at least one computer to perform the functions of:
instruct a plurality of optical switches connected to each other in a series relationship on a signal path to perform optical switching of a phase-modulated optical signal;
instruct a plurality of optical switches connected to each other in a series relationship on a reference path to perform optical switching of a reference optical clock signal;
instruct a plurality of I/Q demodulators to perform I/Q demodulation of the optically switched phase-modulated optical signal respectively output by one of the plurality of optical switches on the signal path at timings corresponding to the optically switched reference optical clock signal respectively output by one of the plurality of optical switches on the reference path, in which the plurality of I/Q demodulators respectively output I and Q demodulated signals as a result thereof; and
instruct a plurality of pairs of gated photodetectors respectively connected to the plurality of I/Q demodulators to perform photodetection of the I and Q demodulated signals respectively output of the plurality of I/Q demodulators.

14. The non-transitory computer readable medium according to claim 13, wherein each of the plurality of pairs of gated photodetectors performs photodetection of the respective I demodulated signal and the Q demodulated signal output by the respective I/Q demodulator in accordance with a clock signal.

15. The non-transitory computer readable medium according to claim 14, further causing the at least one computer to perform the function of:
instruct the plurality of pairs of gated photodetectors to hold the respective I demodulated signal and the Q demodulated signal output by the respective I/Q demodulator for a clock cycle of the clock signal.

16. The non-transitory computer readable medium according to claim 15, wherein a sample-and-hold function is performed in which the plurality of optical switches on the signal path are instructed to distribute the optically sampled signals and in which the plurality of pairs of gated photodetectors are instructed to perform a hold function.

17. The non-transitory computer readable medium according to claim 13, wherein the signal path and the reference path are separate paths that do not directly intersect or directly connect with each other.

18. The non-transitory computer readable medium according to claim 13, further causing the at least one computer to perform the function of:
instructing the phase modulator to perform the phase modulation of an optical signal to obtain the phase-modulated optical signal.

19. A photonic Analog-to-Digital Converter (pADC), comprising:
a phase modulator that is configured to received an rf signal and to output a phase-modulated optical signal as a result thereof;
an I/Q demodulator configured to receive the phase-modulated optical signal output by the phase modulator on a signal path, and to perform I and Q demodulation of the phase-modulated optical signal at timings corresponding to a reference clock signal received on a reference path, wherein the I/Q demodulator outputs an I demodulated signal and a Q demodulated signal as a result thereof; and
first and second gated photodetectors connected to the I/Q demodulator and configured to receive and detect the I demodulated signal and a Q demodulated signal, respectively.

20. The pADC according to claim 19, further comprising:
first and second electronic quantizers connected to the first and second gated photodetectors, respectively, and configured to perform electronic quantization of the detected I demodulated signal and the detected Q demodulated signal as first and second digital signals.

21. The pADC according to claim 19, wherein the first and second gated photodetectors each comprises:
- an optical gate device configured to perform optical gating of the I/Q demodulated signal output by the I/Q demodulator; and
- a photodetector configured to photodetect the optically gated I/Q demodulated signal output by the optical gate device.

22. The pADC according to claim 19, further comprising: the reference clock configured to output the reference optical clock signal to the phase modulator and to the reference path, in which the phase modulator performs phase modulation of the phase-modulated optical signal at timings corresponding to the reference optical clock signal.

23. A method of performing optical serial-to-parallel conversion of an optical pulse stream, comprising:
- performing phase modulation proportional to an rf input signal and outputting a phase-modulated optical signal as a result thereof;
- performing I and Q demodulation of the phase-modulated optical signal at timings corresponding to a reference clock signal received on a reference path, and outputting an I demodulated signal and a Q demodulated signal as a result thereof; and
- receiving and detecting, by way of first and second gated photodetectors, the I demodulated signal and a Q demodulated signal, respectively.

24. The method according to claim 23, wherein the phase modulation of the rf signal is performed at timings corresponding to a reference optical clock signal.

25. A photonic Analog-to-Digital Converter (pADC), comprising:
- an optical phase modulator that is configured to receive an rf signal, an optical pulse signal, and to output a phase-modulated optical pulse signal as a result thereof;
- a plurality of optical switches connected in a series relationship to each other along a signal path, the plurality of optical switches on the signal path configured to perform optical switching of the phase-modulated optical pulse signal output by the phase modulator in accordance with the series relationship by which the plurality of optical switches on the signal path are connected to each other;
- a plurality of optical switches connected in a series relationship to each other along a reference path, the plurality of optical switches on the reference path configured to perform optical switching of a reference optical clock signal in accordance with the series relationship by which the plurality of optical switches on the reference path are connected to each other;
- a plurality of signal processors respectively connected to receive switched outputs from the plurality of optical switches on the signal path and to receive switched outputs from the plurality of optical switches on the reference path, in which each of the plurality of signal processors is configured to perform signal processing of the received switched outputs from the plurality of optical switches on the signal path at timings corresponding to the switched outputs of the plurality of optical switches on the reference path, and in which each of the plurality of signal processors is configured to output a processed signal as a result thereof; and
- a plurality of gated photodetectors respectively connected to the plurality of signal processors, in which each of the gated photodetectors receives the processed signal output from the respective signal processor, and in which each of the gated photodetectors is configured to perform photodetection of the respective processed signal.

26. A photonic Analog-to-Digital Converter (pADC), comprising:
- an optical amplitude modulator that is configured to receive an rf signal, an optical pulse signal, and to output an amplitude-modulated optical pulse signal as a result thereof;
- a plurality of optical switches connected in a series relationship to each other along a signal path, the plurality of optical switches on the signal path configured to perform optical switching of the amplitude-modulated optical pulse signal output by the amplitude modulator in accordance with the series relationship by which the plurality of optical switches on the signal path are connected to each other;
- a plurality of optical switches connected in a series relationship to each other along a reference path, the plurality of optical switches on the reference path configured to perform optical switching of a reference optical clock signal in accordance with the series relationship by which the plurality of optical switches on the reference path are connected to each other;
- a plurality of signal processors respectively connected to receive switched outputs from the plurality of optical switches on the signal path and to receive switched outputs from the plurality of optical switches on the reference path, in which each of the plurality of signal processors is configured to perform signal processing of the received switched outputs from the plurality of optical switches on the signal path at timings corresponding to the switched outputs of the plurality of optical switches on the reference path, and in which each of the plurality of signal processors is configured to output a processed signal as a result thereof; and
- a plurality of gated photodetectors respectively connected to the plurality of signal processors, in which each of the gated photodetectors receives the processed signal output from the respective signal processor, and in which each of the gated photodetectors is configured to perform photodetection of the respective processed signal.

* * * * *